(12) United States Patent
Kim et al.

(10) Patent No.: US 12,538,845 B2
(45) Date of Patent: Jan. 27, 2026

(54) DISPLAY DEVICE AND METHOD OF MANUFACTURING THE SAME

(71) Applicant: LG Display Co., Ltd., Seoul (KR)

(72) Inventors: Byonghoo Kim, Paju-si (KR); DaeHeung Lee, Paju-si (KR); JuHyuk Kim, Paju-si (KR); Aram Sohn, Paju-si (KR); Sumin Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 464 days.

(21) Appl. No.: 18/073,398

(22) Filed: Dec. 1, 2022

(65) Prior Publication Data

US 2023/0215852 A1 Jul. 6, 2023

(30) Foreign Application Priority Data

Dec. 31, 2021 (KR) .................. 10-2021-0194437

(51) Int. Cl.
*H01L 25/16* (2023.01)
*H01L 23/00* (2006.01)

(52) U.S. Cl.
CPC ............ *H01L 25/167* (2013.01); *H01L 24/27* (2013.01); *H01L 24/29* (2013.01); *H01L 24/32* (2013.01);
(Continued)

(58) Field of Classification Search
CPC ... H01L 25/0753; H01L 25/167; H01L 24/27; H01L 24/29; H01L 24/32; H01L 24/83; H01L 23/3185; H01L 2924/12041; H01L 2224/27515; H01L 2224/27502; H01L 2224/32145; H01L 2224/2919; H01L 2224/2747; H01L 2224/29018; H01L 2224/2755; H01L 2224/14; H01L 2224/16225; H10H 20/84; H10H 20/853; H10H 20/825; H10H 20/857; H10H 20/856; H10H 20/8514; H10H 20/812;
(Continued)

(56) References Cited

U.S. PATENT DOCUMENTS

2012/0112220 A1* 5/2012 West .................... H10H 20/855
257/E33.072
2013/0034713 A1 2/2013 Busman et al.
(Continued)

FOREIGN PATENT DOCUMENTS

KR 10-2012-0112549 A 10/2012
KR 10-2017-0116017 A 10/2017
KR 10-2019-0139598 A 12/2019

OTHER PUBLICATIONS

Korean Intellectual Property Office, Notice of Allowance, Korean Patent Application No. 10-2021-0194437, Sep. 11, 2025, five pages.

*Primary Examiner* — Mouloucoulaye Inoussa
(74) *Attorney, Agent, or Firm* — Fenwick & West LLP

(57) ABSTRACT

Embodiments of the present disclosure relate to a display device and a method of manufacturing the same. More specifically, there may be provided includes a display device including an adhesive layer which includes a first portion and a second portion, wherein the first portion has higher adhesion than the second portion, and the second portion has lower adhesion than the first portion and includes high refractive particles so that a manufacturing process is simplified, and a method of manufacturing the same.

18 Claims, 10 Drawing Sheets

(52) U.S. Cl.
CPC ............... *H01L 2224/2747* (2013.01); *H01L 2224/27502* (2013.01); *H01L 2224/27515* (2013.01); *H01L 2224/2755* (2013.01); *H01L 2224/29018* (2013.01); *H01L 2224/2919* (2013.01); *H01L 2224/32145* (2013.01); *H01L 2924/12041* (2013.01)

(58) Field of Classification Search
CPC ............. H10H 20/8515; H10H 20/854; H10H 29/142; H10D 86/60; H10D 86/40; H10D 86/441; H10K 59/879; H10K 59/38; H10K 59/8792; H10K 50/858; H10K 50/865; H10K 50/8426; H10K 2102/331; G02F 1/1336; G02F 1/133512; G02F 1/133514; G02F 1/133617
See application file for complete search history.

(56) References Cited

U.S. PATENT DOCUMENTS

| | | | |
|---|---|---|---|
| 2017/0133357 A1* | 5/2017 | Kuo | H10H 20/855 |
| 2018/0016477 A1 | 1/2018 | Inoue et al. | |
| 2018/0083218 A1* | 3/2018 | Choi | H10K 50/818 |
| 2018/0122786 A1* | 5/2018 | Wu | H01L 24/29 |
| 2018/0122836 A1* | 5/2018 | Kang | H10D 86/451 |
| 2018/0175268 A1* | 6/2018 | Moon | H01L 25/0753 |
| 2018/0321558 A1* | 11/2018 | Hu | G02F 1/133605 |
| 2019/0121176 A1* | 4/2019 | Lee | H10K 59/879 |
| 2019/0198735 A1* | 6/2019 | Tsai | H01L 25/0753 |
| 2020/0135971 A1* | 4/2020 | Beak | H10K 59/173 |
| 2020/0168777 A1* | 5/2020 | Kang | H10H 20/857 |
| 2020/0212026 A1* | 7/2020 | Son | H10H 29/142 |
| 2020/0328332 A1* | 10/2020 | Song | H10H 20/854 |
| 2021/0118856 A1* | 4/2021 | Wu | H10H 20/819 |
| 2022/0085100 A1* | 3/2022 | Cho | H10H 29/142 |
| 2022/0173269 A1* | 6/2022 | An | H10H 20/01 |
| 2022/0199941 A1* | 6/2022 | Kim | H10K 50/8426 |
| 2022/0246673 A1* | 8/2022 | Suh | H01L 25/0753 |
| 2023/0275193 A1* | 8/2023 | Hong | H01L 25/167 |
| 2023/0288583 A1* | 9/2023 | Nagai | G01T 1/20189 |
| 2024/0128416 A1* | 4/2024 | Kim | H10D 86/451 |

* cited by examiner

DISPLAY DEVICE AND METHOD OF MANUFACTURING THE SAME

CROSS REFERENCE TO RELATED APPLICATIONS

This application claims priority from Republic of Korea Patent Application No. 10-2021-0194437, filed on Dec. 31, 2021, which is hereby incorporated by reference for all purposes as if fully set forth herein.

BACKGROUND

1. Field

Embodiments of the present disclosure relates to a display device and a method of manufacturing the same.

2. Description of the Related Art

With the development of technology, display devices including self-light-emitting elements have been invented. A display device including a self-light-emitting element may include an organic light-emitting display device including a light-emitting layer made of an organic material and a micro light-emitting diode (LED) display device using micro light-emitting elements.

A micro light-emitting element is a micro light-emitting element having a size of several tens of micrometers or less. When such a micro light-emitting element is used for a pixel, it is possible to reduce the size and weight of a display device. However, since a micro light-emitting element is very small and a large number of light-emitting elements should be formed, there are problems in that it requires a long time and a high cost to manufacture.

SUMMARY

In order to manufacture a display device using micro light-emitting elements, the micro light-emitting elements may be crystallized on a sapphire or silicon substrate, and the crystallized micro light-emitting elements may be transferred onto a substrate including a driving circuit. A process of transferring micro light-emitting elements may be performed using a method of stamping a temporary substrate, on which the micro light-emitting elements are formed, on a substrate on which a driving circuit and an adhesive layer are formed. However, when a size of the micro light-emitting element becomes small, there is a problem in that the transfer is not performed well. In addition, the picked-up temporary substrate cannot be used multiple times, and thus the existing temporary substrate should be separated after stamping and another temporary substrate should be input, which has caused a problem in that the process is cumbersome. Accordingly, in one example, a display device and a method of manufacturing the same in which transfer process yield may be excellent and an input temporary substrate may be used multiple times is described.

An aspect of the present disclosure is to provide a display device including an adhesive layer which includes a first portion and a second portion, wherein the first portion has higher adhesion than the second portion, and the second portion has lower adhesion than the first portion and includes high refractive particles.

Another aspect of the present disclosure is to provide a method of manufacturing a display device, which includes irradiating ultraviolet light onto a substrate on which an adhesive layer is positioned and pressing a stamp, on which a light-emitting element is positioned, on the substrate, thereby being able to have excellent transfer yield and use an input temporary substrate multiple times.

In an aspect, embodiments of the present disclosure provide a display device including a substrate, a thin film transistor layer positioned on the substrate, an adhesive layer disposed on the thin film transistor layer, and a light-emitting element positioned on the adhesive layer.

The adhesive layer may include a first portion and a second portion. The first portion may have higher adhesion than the second portion, and the second portion may have lower adhesion than the first portion and may include high refractive particles.

The light-emitting element may be positioned on the first portion.

In another aspect, embodiments of the present disclosure provide a method of manufacturing a display device including irradiating ultraviolet light onto an adhesive layer positioned on a substrate, and pressing a stamp having a surface, on which a light-emitting element is positioned, onto the adhesive layer onto which the ultraviolet light is irradiated, and bonding the light-emitting element to the adhesive layer.

In another aspect, embodiments of the present disclosure provide a substrate, one or more thin film transistors on the substrate, an adhesive layer disposed on the one or more thin film transistors. The adhesive layer may include a binder and a photosensitizer, and the adhesive layer may include one or more first portions and one or more second portions disposed between the one or more first portions. A first portion may include a first material and a second portion including a second material different from the first material. The display device may further include one or more light-emitting elements disposed on the one or more first portions of the adhesive layer.

According to embodiments of the present disclosure, there can be provided a display device including an adhesive layer which includes a first portion and a second portion, wherein the first portion has higher adhesion than the second portion, and the second portion has lower adhesion than the first portion and includes high refractive particles so that a manufacturing process is simplified.

According to embodiments of the present disclosure, there can be provided a method of manufacturing a display device, in which, before a stamp is pressed onto a substrate, ultraviolet light is irradiated onto an adhesive layer positioned on the substrate to allow the remaining portions to lose adhesion excluding a portion to which a light-emitting element is to be bonded, thereby allowing the stamp having a surface, on which the light-emitting element is positioned, to be used multiple times.

BRIEF DESCRIPTION OF THE DRAWINGS

The above and other aspects, features and advantages of the present disclosure will be more apparent from the following detailed description taken in conjunction with the accompanying drawings.

DETAILED DESCRIPTION OF THE EMBODIMENTS

Figure 1:
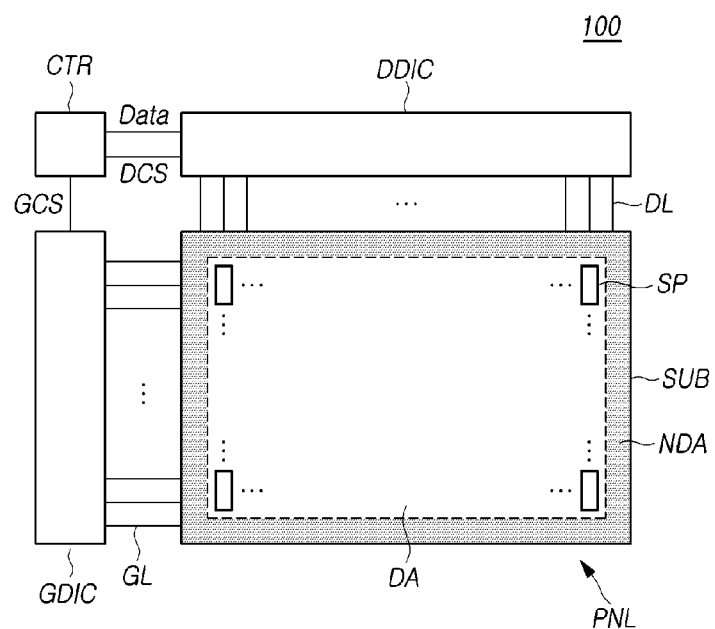
FIG. 1 is a system configuration diagram of a display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "made up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to the accompanying drawings.

FIG. 1 is a system configuration diagram of a display device 100 according to embodiments of the present disclosure.

Referring to FIG. 1, the display device 100 according to embodiments of the present disclosure may include a display panel PNL and a driving circuit for driving the display panel PNL.

The driving circuit may include a data driving circuit DDIC and a gate driving circuit GDIC and may further include a controller CTR for controlling the data driving circuit DDIC and the gate driving circuit GDIC.

The display panel PNL may include a substrate SUB and signal lines such as a plurality of data lines DL and a plurality of gate lines GL disposed on the substrate SUB. The display panel PNL may include a plurality of subpixels SP connected to the plurality of data lines DL and the plurality of gate lines GL.

The display panel PNL may include a display area DA in which an image is displayed and a non-display area NDA in which an image is not displayed. In the display panel PNL, the plurality of subpixels SP for displaying an image may be disposed in the display area DA. In the non-display area NDA, the driving circuits DDIC and GDIC, and the controller CTR may be electrically connected or mounted, and a pad portion to which an integrated circuit or a printed circuit is connected may also be disposed.

The data driving circuit DDIC may be a circuit for driving the plurality of data lines DL and may supply data voltages to the plurality of data lines DL. The gate driving circuit GDIC may be a circuit for driving the plurality of gate lines GL and may supply gate signals to the plurality of gate lines GL. The controller CTR may supply a data control signal DCS to the data driving circuit DDIC to control an operation timing of the data driving circuit DDIC. The controller CTR may supply a gate control signal GCS to the gate driving circuit GDIC to control an operation timing of the gate driving circuit GDIC.

The controller CTR may start a scan according to a timing set implemented in each frame. The controller CTR may convert input image data input from an external device to be suitable for a data signal format used by the data driving circuit DDIC, may output the converted image data to the data driving circuit DDIC, and may control data driving at an appropriate time according to the scan.

In order to control the gate driving circuit GDIC, the controller CTR may output various gate control signals GCS including gate start pulse (GSP), gate shift clock (GSC), and gate output enable (GOE) signals.

In order to control the data driving circuit DDIC, the controller CTR may output various data control signals DCS including source start pulse (SSP), source sampling clock (SSC), and source output enable (SOE) signals.

The controller CTR may be implemented as a separate component from the data driving circuit DDIC or may be integrated with the data driving circuit DDIC and implemented as an integrated circuit.

The data driving circuit DDIC receives image data Data from the controller CTR and supplies data voltages to the plurality of data lines DL to drive the plurality of data lines DL. Here, the data driving circuit DDIC is also referred to as a source driving circuit.

The data driving circuit DDIC may include one or more source driver integrated circuits (SDICs).

For example, each SDIC may be connected to the display panel PNL in a tape automated bonding (TAB) manner, may be connected to a bonding pad of the display panel PNL in a chip-on-glass (COG) or chip-on-panel (COP) manner, or may be implemented as a chip-on-film (COF) type and connected to the display panel PNL.

The gate driving circuit GDIC may output a gate signal having a turn-on level voltage or a gate signal having a turn-off level voltage under the control of the controller CTR. The gate driving circuit GDIC may sequentially drive the plurality of gate lines GL by sequentially supplying a gate signal having a turn-on level voltage to the plurality of gate lines GL.

The gate driving circuit GDIC may be connected to the display panel PNL in a TAB manner, may be connected to a bonding pad of the display panel PNL in a COG or COP manner, or may be connected to the display panel PNL in a COF manner. Alternatively, the gate driving circuit GDIC may be formed in the non-display area NDA of the display panel PNL as a gate-in-panel (GIP) type. The gate driving circuit GDIC may be disposed on or connected to the substrate SUB. That is, when the gate driving circuit GDIC is the GIP type, the gate driving circuit GDIC may be disposed in the non-display area NDA of the substrate SUB. When the gate driving circuit GDIC is the COG type, the COF type, or the like, the gate driving circuit GDIC may be connected to the substrate SUB.

Meanwhile, at least one driving circuit of the data driving circuit DDIC and the gate driving circuit GDIC may be disposed in the display area DA. For example, at least one driving circuit of the data driving circuit DDIC and the gate driving circuit GDIC may be disposed to not overlap the subpixels SP or may be disposed such that a portion or the entirety thereof overlaps the subpixels SP.

When a specific gate line GL is opened by the gate driving circuit GDIC, the data driving circuit DDIC may convert the image data Data received from the controller CTR into an analog data voltage and may supply the analog data voltage to the plurality of data lines DL.

The data driving circuit DDIC may be connected to one side (for example, an upper or lower side) of the display panel PNL. According to a driving method, a panel design method, or the like, the data driving circuit DDIC may be connected to two sides (for example, the upper and lower sides) of the display panel PNL or may be connected to two or more sides of the four sides of the display panel PNL.

The gate driving circuit GDIC may be connected to one side (for example, a left side or a right side) of the display panel PNL. According to a driving method, a panel design method, or the like, the gate driving circuit GDIC may be connected to two sides (for example, the left and right sides) of the display panel PNL or may be connected to two or more sides of the four sides of the display panel PNL.

The controller CTR may be a timing controller used in typical display technology, may be a control device which may include the timing controller to further perform other control functions, may be a control device different from the timing controller, or may be a circuit inside a control device. The controller CTR may be implemented with various circuits or electronic components such as an integrated circuit (IC), a field programmable gate array (FPGA), an application specific integrated circuit (ASIC), and a processor.

The controller CTR may be mounted on a printed circuit board, a flexible printed circuit, or the like and may be electrically connected to the data driving circuit DDIC and the gate driving circuit GDIC through the printed circuit board or the flexible printed circuit.

The display device 100 according to the present embodiments may be a micro light-emitting diode (micro LED) display. The subpixel SP may include a micro LED, which emits light by itself and is made based on an inorganic material, as a light-emitting element.

Figure 2:
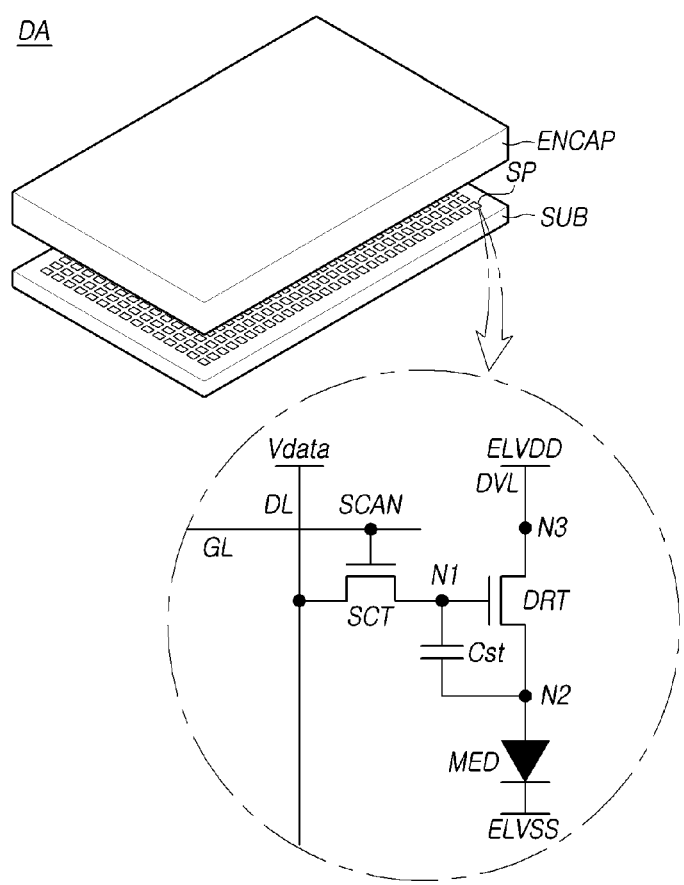
FIG. 2 shows a configuration diagram of a display area and a circuit diagram of a subpixel of a display device according to embodiments of the present disclosure.

FIG. 2 is an equivalent circuit of a subpixel SP in a display panel PNL according to embodiments of the present disclosure.

Each subpixel SP disposed in a display area DA of the display panel PNL may include a light-emitting element MED, a driving transistor DRT for driving the light-emitting element MED, a scan transistor SCT for transmitting a data voltage Vdata to a first node N1 of the driving transistor DRT, a storage capacitor Cst for maintaining a constant voltage during one frame, and the like.

The driving transistor DRT may include the first node N1 to which the data voltage is applied, a second node N2 electrically connected to the light-emitting element MED, and a third node N3 to which a driving voltage ELVDD is applied from a driving voltage line DVL. In the driving transistor DRT, the first node N1 may be a gate node, the second node N2 may be a source node or a drain node, and the third node N3 may be a source node or a drain node.

The scan transistor SCT is controlled to be turned on/off by a scan signal SCAN that is a gate signal applied through a gate line GL. The scan transistor SCT may be electrically connected between the first node N1 of the driving transistor DRT and a data line DL.

The storage capacitor Cst may be electrically connected between the first node N1 and the second node N2 of the driving transistor DRT.

Each subpixel SP may have a 2T (transistor)-1C (capacitor) structure including two transistors DRT and SCT and one capacitor Cst as shown in FIG. 2. In some cases, each subpixel SP may further include one or more transistors or further include one or more capacitors.

The storage capacitor Cst is not a parasitic capacitor (for example, Cgs or Cgd) which is an internal capacitor that may be present between the first node N1 and the second node N2 of the driving transistor DRT and may be an external capacitor which is intentionally designed outside the driving transistor DRT.

Each of the driving transistor DRT and the scan transistor SCT may be an n-type transistor or a p-type transistor.

Since circuit elements (in particular, the light-emitting element MED) in each subpixel SP are vulnerable to external moisture or oxygen, an encapsulation layer ENCAP may be disposed on the display panel PNL to prevent the external moisture or oxygen from penetrating into the circuit elements (in particular, the light-emitting element MED). The encapsulation layer ENCAP may be disposed in a form which covers the light-emitting elements MED.

Figure 3:
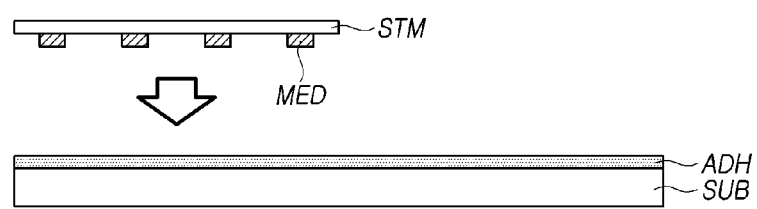
FIG. 3 is a view illustrating an operation of pressing a stamp in a method of manufacturing a display device according to a comparative example of the present disclosure.

FIG. 3 is a view illustrating an operation of pressing a stamp in a method of manufacturing a display device according to a comparative example of the present disclosure.

Light-emitting elements MED may be positioned on one surface of a stamp STM. The stamp STM having a surface on which the light-emitting elements MED are positioned may be pressed onto a substrate SUB on which an adhesive layer ADH is formed on one surface thereof, thereby bonding the light-emitting elements MED onto the substrate SUB.

In the operation of the pressing, the adhesive layer ADH may be in a state of being patterned through ultraviolet irradiation. For example, adhesion of the adhesive layer ADH may be locally adjusted by irradiating ultraviolet light onto the adhesive layer ADH using a mask.

Figure 4:
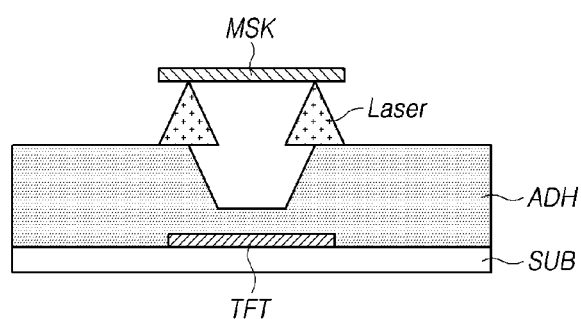
FIGS. 4 and 5 are views illustrating an operation of irradiating ultraviolet light in the method of manufacturing a display device according to the comparative example of the present disclosure.

FIG. 4 is a view illustrating an operation of irradiating ultraviolet light in the method of manufacturing a display device according to the comparative example of the present disclosure.

Referring to FIG. 4, by using a laser, ultraviolet light may be irradiated onto one surface of the substrate SUB on which a thin film transistor TFT is positioned and on which the adhesive layer ADH is positioned on the thin film transistor TFT. When ultraviolet light is irradiated, adhesion of the adhesive layer ADH may be adjusted using a mask MSK.

A method of controlling adhesion of the adhesive layer ADH by irradiating ultraviolet light may be performed through a method in which the adhesive layer ADH includes a photosensitive material and the photosensitive material included in the adhesive layer ADH reacts with ultraviolet light to change adhesion. In order to locally adjust adhesion of the adhesive layer ADH, ultraviolet light may be irradiated using the mask MSK. For example, an area irradiated with ultraviolet light may have lowered adhesion, and an area not irradiated with ultraviolet light may maintain adhesion.

Figure 5:
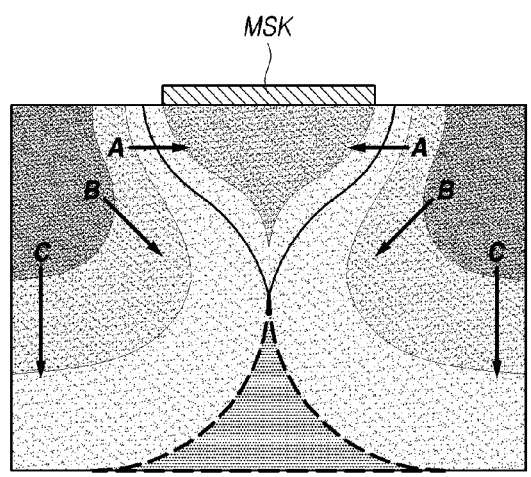

FIG. 5 is a view illustrating an operation of irradiating ultraviolet light in the method of manufacturing a display device according to the comparative example of the present disclosure.

When the light-emitting element to be transferred is a micro light-emitting element, since a size thereof is very small, the mask MSK for patterning the adhesive layer also has a very small pattern.

When light is irradiated onto the mask MSK having a very small pattern, there is a problem in that the pattern is not accurately defined due to a diffraction phenomenon. For example, there are problems in that, due to diffraction, light may also travel in directions A and B, and the adhesive layer may also be exposed in directions other than a direction C in which the adhesive layer is to be exposed by the mask MSK. Therefore, when a light-emitting element is transferred onto an adhesive layer, in which a pattern is not precisely defined, using a stamp, due to a diffraction phenomenon, there is a problem in that transfer yield is lowered.

Figure 6:
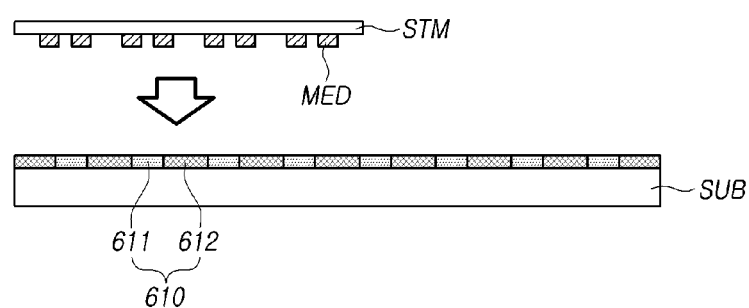
FIGS. 6 and 7 are views illustrating an operation of pressing a stamp in a method of manufacturing a display device according to embodiments of the present disclosure.
Figure 7:
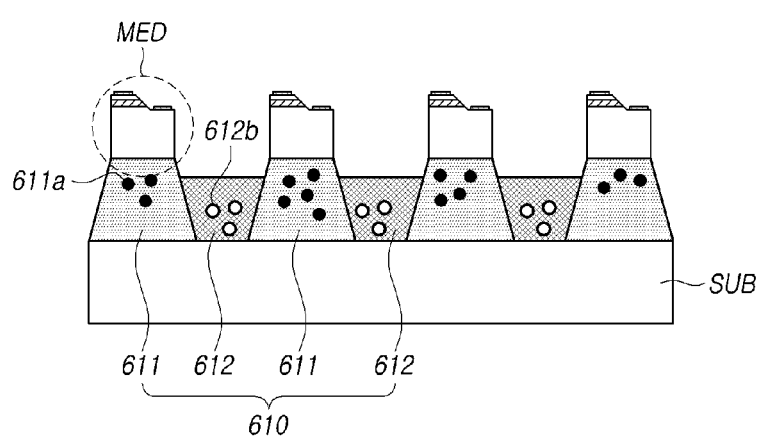

FIGS. 6 and 7 are views illustrating an operation of pressing a stamp in a method of manufacturing a display device according to embodiments.

Referring to FIG. 6, the method of manufacturing a display device according to embodiments of the present disclosure may include positioning a stamp STM having a surface, on which light-emitting elements MED are positioned, on a substrate SUB, and bonding the stamp STM to an adhesive layer 610 including first portions 611 and second portions 612.

The adhesive layer 610 may include a binder and a photosensitizer. For example, the binder may be at least one selected from an alkali-developable binder and a silicon-based binder. The photosensitizer may be at least one selected from an oxime-based photoinitiator and a benzophenone-based photoinitiator. Since the adhesive layer 610 includes the binder and the photosensitizer, it may include the first portion 611 and the second portion 612 which are patterned by ultraviolet light.

Adhesion of the first portion 611 of the adhesive layer 610 may be stronger than that of the second portion 612, and the adhesion of the second portion 612 may be weaker than that of the first portion 611. For example, the second portion 612 may be a portion having substantially no adhesion. Accordingly, when the stamp STM is pressed onto the adhesive layer 610, the light-emitting element MED may be bonded only to the first portion 611 and may not be bonded to the second portion 612.

Referring to FIG. 7, the light-emitting element MED may be bonded onto the first portion 611, and the light-emitting element MED may not be bonded onto the second portion 612. This may be because the first portion 611 is a portion whose adhesion is enhanced by ultraviolet light and the second portion 612 is a portion whose adhesion is weakened by ultraviolet irradiation.

The first portion 611 may include a binder and a photosensitizer. For example, the binder may be at least one selected from an alkali-developable binder and a silicon-based binder. The photosensitizer may be at least one selected from an oxime-based photoinitiator and a benzophenone-based photoinitiator. In one instance, the adhesive layer 610 may include one or more first portions 611 and one or more second portions 612 disposed between the first portions 611. A first portion 611 may include photosensitive material 611a and a second portion 612 may include high refractive particles 612b.

Since the first portion 611 includes a photosensitive material 611a whose adhesion is improved when ultraviolet light is irradiated, adhesion thereof may be enhanced by ultraviolet light so that the light-emitting element MED may be easily bonded to the first portion 611.

Since the photosensitive material 611a has a structure that is difficult to densely pack, a free volume between molecules may be large and an intermolecular attractive force may be small, and thus the photosensitive material 611a may have a rubbery phase due to ultraviolet irradiation, thereby enhancing the adhesion of the first portion 611.

The photosensitive material 611a may be an azobenzene derivative. The azobenzene derivative may be, for example, 4,4'-bis(hexyloxy)-3-methylazobenzene, 4,4'-bis(decyloxy)-3-methylazobenzene, 4,4'-bis(dodecyloxy)-3-methylazobenzene, or the like.

A result of comparing adhesion of the first portion 611 including the azobenzene derivative before and after ultraviolet irradiation is shown in Table 1 below. An adhesive property was confirmed through a probe tack test, and an adhesive strength property was confirmed through a die shear test.

TABLE 1

| Process | Probe tack test (gf) | Die shear test (gf/in$^2$) | Photosensitive material structure |
|---|---|---|---|
| Before ultraviolet irradiation | 4.0 | 0.70 | 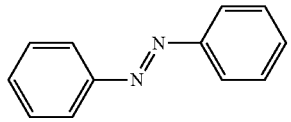 trans form |
| After ultraviolet irradiation | 5.3 | 5.35 | 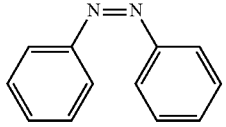 cis form |

Referring to Table 1, it can be seen that, after ultraviolet irradiation, a structure of the photosensitive material 611a is converted from a trans form to a cis form, and thus adhesion is improved.

Since the second portion 612 includes high refractive particles 612b, when ultraviolet light is irradiated onto the adhesive layer 610, a photosensitive material included in the second portion 612 may be cured by ultraviolet light to lose adhesion, and thus the light-emitting element MED may not be bonded to the second portion 612.

The second portion 612 may be a portion having lower adhesion than the first portion 611 and may be a portion which is cured by ultraviolet light to lose adhesion. Since the second portion 612 includes the high refractive particles 612b, when ultraviolet light uniformly reaches the inside of the second portion 612, a photosensitive resin included in the second portion 612 may be better cured by ultraviolet light to lose adhesion.

The high refractive particles 612b may be, for example, a material in which titanium oxide or iron oxide, which is a metal oxide, is supported on mesoporous Mobil Composition of Matter No. 41 (MCM-41) or Santa Barbara Amorphous (SBA-15).

The second portion 612 may include a binder and a photosensitizer. For example, the binder may be at least one selected from an alkali-developable binder and a silicone-based binder. The photosensitizer may be at least one selected from an oxime-based photoinitiator and a benzophenone-based photoinitiator.

The first portion 611 may have a tapered shape. The first portion 611 having the tapered shape may mean that the first portion 611 has a shape that gradually becomes narrower in a direction away from the substrate SUB.

The second portion 612 may have a reverse tapered shape. The second portion 612 having the reverse tapered shape may mean that the second portion 612 has a shape that gradually becomes wider in a direction away from the substrate SUB.

Since the first portion 611 has the tapered shape and the second portion 612 has the reverse tapered shape, the first portion 611 bonded to the light-emitting element MED has a wider contact with the lower substrate SUB, thereby preventing the delamination of the adhesive layer 610 in a process of pressing and then removing a temporary substrate. Thus, in one instance, a width of a bottom surface of the first portion 611 may be greater than a width of an upper surface of the first portion 611. A width of an upper surface of the second portion 612 may be greater than a width of a bottom surface of the second portion 612.

The first portion 611 may include a portion that protrudes further than the second portion 612. The first portion 611 including the portion that protrudes further than the second portion 612 may mean that the first portion 611 is thicker than the second portion 612. Since the first portion 611 includes the portion that protrudes further than the second portion 612, the light-emitting element MED may be transferred in higher yield in a process of pressing a temporary substrate, on which the light-emitting element MED is formed, onto the adhesive layer 610. In one instance an upper surface of the first portion 611 is at a first distance from the substrate and an upper surface of the second portion 612 is at a second distance from the substrate shorter than the first distance.

Figure 8:
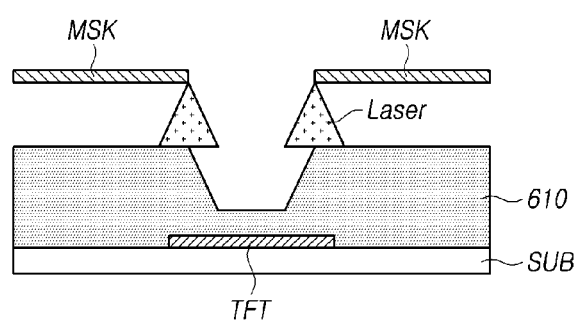
FIGS. 8 and 9 are views illustrating an operation of irradiating ultraviolet light in the method of manufacturing a display device according to embodiments of the present disclosure.
Figure 9:
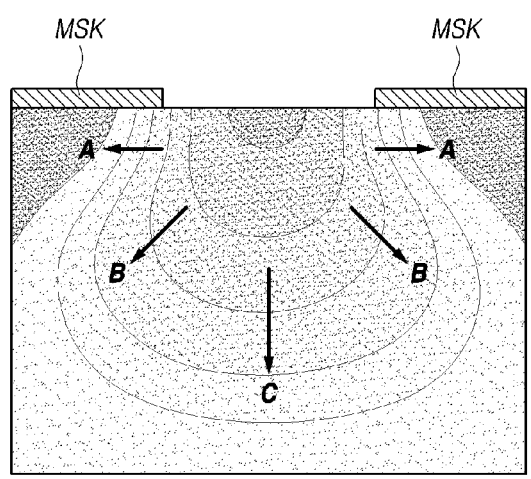

FIGS. 8 and 9 are views illustrating an operation of irradiating ultraviolet light in the method of manufacturing a display device according to embodiments of the present disclosure.

Referring to FIG. 8, by using a laser, ultraviolet light may be irradiated onto one surface of the substrate SUB on which a thin film transistor TFT is positioned and on which the adhesive layer 610 is positioned on the thin film transistor TFT. When ultraviolet light is irradiated, adhesion of the adhesive layer 610 may be adjusted using a mask MSK. For example, an area irradiated with ultraviolet light may have lower adhesion, and an area not irradiated with ultraviolet light may maintain adhesion. Due to the mask MSK, ultraviolet light may not be irradiated to the first portion of the adhesive layer 610 and may be irradiated to a second portion.

FIG. 9 is a view illustrating an operation of irradiating ultraviolet light in the method of manufacturing a display device according to embodiments of the present disclosure.

Referring to FIG. 9, it can been seen that the method of manufacturing a display device according to embodiments of the present disclosure has difficulty in performing a fine patterning operation due to diffraction during a patterning process using a mask MSK. However, in a display device according to embodiments of the present disclosure, when ultraviolet light is irradiated onto the first portion 611 and the second portion 612, since adhesion of the first portion 611 is enhanced and adhesion of the second portion 612 is lowered, even when diffraction occurs in the patterning process using the mask MSK, fine patterning is possible.

An operation of irradiating ultraviolet light onto the adhesive layer including the first portion and the second portion may be an operation of enhancing adhesion of the first portion and weakening adhesion of the second portion.

Since the photosensitive material included in the first portion may have a rubbery phase due to ultraviolet irradiation, adhesion of the first portion may be enhanced.

The high refractive particles included in the second portion may increase an amount of light that passes through the mask to reach the second portion and may cure a polymer or oligomer included in the second portion. When the polymer or oligomer included in the second portion is cured, the second portion may lose adhesion. Accordingly, the operation of irradiating the ultraviolet light may be an operation of weakening the adhesion of the second portion and may be an operation of causing the second portion to substantially lose adhesion.

Referring to FIG. 6, when the second portion 612 loses adhesion, the light-emitting element MED may not be bonded to the second portion 612. Referring to FIG. 7, the light-emitting element MED may be bonded only to the first portion 611 and may not be bonded to the second portion 612.

Figure 10:
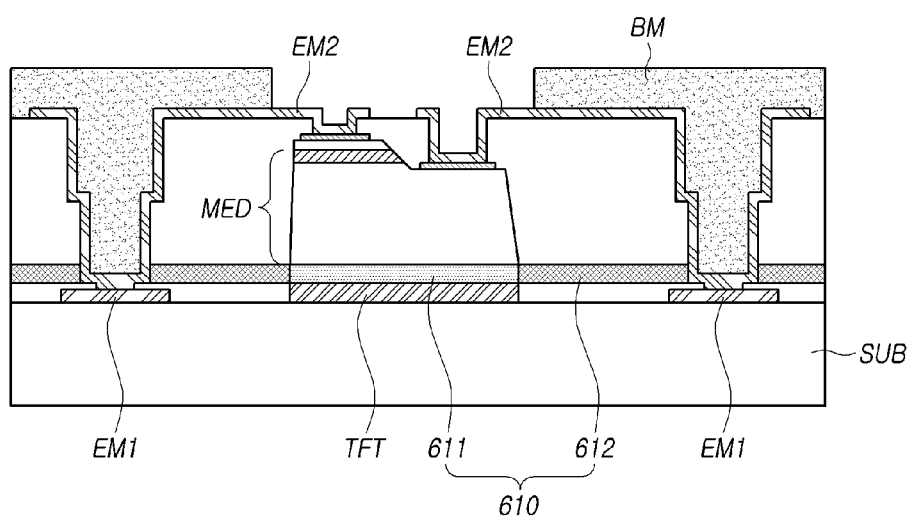
FIG. 10 is a cross-sectional view of a display device according to embodiments of the present disclosure.

FIG. 10 is a cross-sectional view of a display device according to embodiments of the present disclosure.

Referring to FIG. 10, the display device may include a substrate SUB, a thin film transistor layer TFT, an adhesive layer 610 including a first portion 611 and a second portion 612, and a light-emitting element MED positioned on the adhesive layer 610. In addition, the display device may include metal electrodes EM1 and EM2 and a black matrix BM and may also include a plurality of insulating films. A part of the metal electrode EM1 of the metal electrodes is positioned on a transistor layer and may be a part of a circuit element constituting a subpixel circuit. A part of the metal EM2 of the metal electrodes may be an electrode connected to an anode and a cathode of a light-emitting element MED.

The adhesive layer 610 may include a binder and a photosensitizer. For example, the binder may be at least one selected from an alkali-developable binder and a silicon-based binder. The photosensitizer may be at least one selected from an oxime-based photoinitiator and a benzophenone-based photoinitiator. Since the adhesive layer 610 includes the binder and the photosensitizer, the adhesive layer 610 includes the first portion 611 and the second portion 612 which are patterned by ultraviolet light.

The first portion 611 may have higher adhesion than the second portion 612.

The second portion 612 may have lower adhesion than the first portion 611. For example, the second portion 612 may have a higher degree of curing than the first portion 611, and thus the second portion 612 may be a portion which loses adhesion. In one instance, an adhesion of the first portion 611 may be higher than an adhesion of the second portion 612 as measured with respect to a probe tack test (gf) or a die shear test (gf/in$^2$).

Since the first portion 611 has high adhesion and the second portion 612 has low adhesion, the light-emitting element MED may be positioned only on the first portion 611 and may not be positioned on the second portion 612. The light-emitting element MED not being positioned on the second portion 612 may mean that the light-emitting element MED is not positioned on the second portion 612 or is positioned to not overlap the second portion 612. In addition, a process of manufacturing the display device may be more easily performed.

The second portion 612 may include high refractive particles. Since the second portion 612 includes the high refractive particles, the first portion 611 and the second portion 612 of the adhesive layer 610 can be patterned more precisely, and as a result, a process of transferring the light-emitting element MED can have higher yield.

The above-described embodiments of the present disclosure will be briefly described below.

A display device according to embodiments of the present disclosure may include a substrate SUB, a thin film transistor layer TFT positioned on the substrate SUB, an adhesive layer 610 positioned on the thin film transistor layer TFT, and a light-emitting element MED positioned on the adhesive layer 610.

The adhesive layer 610 may include a first portion 611 and a second portion 612.

The light-emitting element MED may be positioned on the first portion 611.

The first portion 611 may have higher adhesion than the second portion 612.

The second portion 612 may have lower adhesion than the first portion 611 and may include high refractive particles.

The first portion 611 may have a tapered shape.

The second portion 612 may have a reverse tapered shape.

The adhesive layer 610 may include a binder and a photosensitizer.

The first portion 611 may include a photosensitive material 611a whose adhesion is lowered when ultraviolet light is irradiated.

The photosensitive material 611a may be an azobenzene derivative.

The first portion 611 may include a portion that protrudes further than the second portion 612.

The second portion 612 may have a higher degree of curing than the first portion 611.

The light-emitting element MED may not be positioned on the second portion 612.

A method of manufacturing a display device according to embodiments of the present disclosure may include irradiating ultraviolet light onto an adhesive layer ADH which is positioned on a substrate SUB and includes a first portion 611 and a second portion 612 including high refractive particles 612b, and pressing a stamp STM having a surface, on which a light-emitting element MED is positioned, onto the adhesive layer ADH onto which the ultraviolet light is irradiated, and bonding the light-emitting element MED to the first portion 611 of the adhesive layer ADH.

The irradiating of the ultraviolet light may include irradiating the ultraviolet light onto the first portion 611 and the second portion 612.

The irradiating of the ultraviolet light may include enhancing adhesion of the first portion 611 and weakening adhesion of the second portion 612.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device comprising:
a substrate;
a thin film transistor layer positioned on the substrate;
an adhesive layer disposed on the thin film transistor layer and including a first portion and a second portion; and
a light-emitting element positioned on the adhesive layer and positioned on the first portion of the adhesive layer, wherein
the first portion has higher adhesion than the second portion, and wherein the second portion has lower adhesion than the first portion and comprises high refractive particles.

2. The display device of claim 1, wherein the first portion has a tapered shape.

3. The display device of claim 1, wherein the second portion has a reverse tapered shape.

4. The display device of claim 1, wherein the adhesive layer comprises a binder and a photosensitizer.

5. The display device of claim 1, wherein the first portion comprises a photosensitive material that in adhesion when ultraviolet light is irradiated on the photosensitive material.

6. The display device of claim 5, wherein the photosensitive material is an azobenzene derivative.

7. The display device of claim 1, wherein the first portion comprises a portion that protrudes further than the second portion.

8. The display device of claim 1, wherein the second portion has a higher degree of curing than the first portion.

9. The display device of claim 1, wherein the light-emitting element is not positioned on the second portion.

10. A display device comprising:
a substrate;
one or more thin film transistors on the substrate;
an adhesive layer disposed on the one or more thin film transistors, wherein the adhesive layer includes a binder and a photosensitizer, and wherein the adhesive layer comprises one or more first portions and one or more second portions disposed between the one or more first portions, a first portion including a first material and a second portion including a second material different from the first material; and
one or more light-emitting elements disposed on the one or more first portions of the adhesive layer.

11. The display device of claim 10, wherein the one or more light-emitting elements are micro light-emitting diodes (LEDs).

12. The display device of claim 10, wherein the first material is a photosensitive material that increases adhesion when irradiated with ultraviolet (UV) light.

13. The display device of claim 10, wherein the first material is an azobenzene derivative compound.

14. The display device of claim 10, wherein the second material are high refractive particles including metal oxide particles.

15. The display device of claim 14, wherein the metal oxide particles are one or a combination of titanium oxide particles or iron oxide particles.

16. The display device of claim 10, wherein an upper surface of the first portion is at a first distance from the substrate and an upper surface of the second portion is at a second distance from the substrate shorter than the first distance.

17. The display device of claim 10, wherein a width of a bottom surface of the first portion is greater than a width of an upper surface of the first portion.

18. The display device of claim 10, wherein an adhesion of the first portion is higher than an adhesion of the second portion with respect to a probe tack test (gf) or a die shear test ($gf/in^2$).

* * * * *